United States Patent
Liu et al.

(10) Patent No.: US 8,422,185 B2
(45) Date of Patent: *Apr. 16, 2013

(54) METHOD AND DEVICE FOR DELAYING ACTIVATION TIMING OF OUTPUT DEVICE

(75) Inventors: Dong-Yi Liu, Miaoli County (TW); Hsiang-Chung Chang, Hsinchu (TW)

(73) Assignee: Anpec Electronics Corporation, Hsinchu Science Park, Hsin-Chu (TW)

( * ) Notice: Subject to any disclaimer, the term of this patent is extended or adjusted under 35 U.S.C. 154(b) by 338 days.

This patent is subject to a terminal disclaimer.

(21) Appl. No.: 12/912,713

(22) Filed: Oct. 26, 2010

(65) Prior Publication Data

US 2011/0317317 A1 Dec. 29, 2011

(30) Foreign Application Priority Data

Jun. 23, 2010 (TW) ................................ 99120510 A

(51) Int. Cl.
*H02H 3/08* (2006.01)
*H03K 17/16* (2006.01)

(52) U.S. Cl.
USPC ............................................ 361/93.1; 327/387

(58) Field of Classification Search ................. 361/93.1; 327/387
See application file for complete search history.

(56) References Cited

U.S. PATENT DOCUMENTS 8,159,281 B2 * 4/2012 Chang et al. .................. 327/387
2002/0140293 A1 * 10/2002 Rothleitner et al. ............ 307/64

* cited by examiner

*Primary Examiner* — Scott Bauer
(74) *Attorney, Agent, or Firm* — Winston Hsu; Scott Margo

(57) ABSTRACT

A delay method for determining an activation time of an output device in a circuit system is disclosed. The delay method includes determining resistance of an over-current flag pull-high resistor of the circuit system, generating a current according to the resistance of the over-current flag pull-high resistor and a voltage drop across the resistor, duplicating the current to generate a division current, drawing the division current from a charging current to determine an activation current of the output device, and determining the activation time point of the output device according to the activation current.

29 Claims, 9 Drawing Sheets

METHOD AND DEVICE FOR DELAYING ACTIVATION TIMING OF OUTPUT DEVICE

BACKGROUND OF THE INVENTION

1. Field of the Invention

The present invention is related to a delay method and device, and more particularly, to a delay method and device for delaying activation timing of an output device.

2. Description of the Prior Art

A Universal Serial Bus (USB) is a convenient and economic solution for electrical connection, especially for "hot attach and detach" and "plug and play" applications. Characterized by expansibility, easy installation and high transmission rate, the USB is widely employed in computer systems, and is utilized for connecting the computer systems with USB peripherals, such as a keyboard, mouse, portable hard disk, compact disc read-only memory (CD-ROM) drive, joystick, printer, scanner, etc.

Please refer to FIG. 1A, which is a schematic diagram of a circuit system 10 of the prior art. The circuit system 10 is generally installed on a main board of a computer system to provide power conforming to USB standards. The circuit system 10 includes a power end PWR, switch units 100_1, 100_2, 100_3, 100_4, a control unit 110 and output ports USB[1], USB[2], USB[3], USB[4]. When the computer system is powered on, the control unit 110 generates an enable signal ENB to respectively indicate to the switch units 100_1, 100_2, 100_3, 100_4 to connect the power end PWR and the output ports USB[1], USB[2], USB[3], USB[4], so as to provide output voltages Vo[1], Vo[2], Vo[3], Vo[4] according to a supply voltage VCC received by the power end PWR and charge output capacitors C_1, C_2, C_3, C_4. As a result, the output voltages Vo[1], Vo[2], Vo[3], Vo[4] can be respectively transmitted to external electronic devices via the output ports USB[1], USB[2], USB[3], USB[4].

To protect the circuit system 10, each of the switch units 100_1, 100_2, 100_3, 100_4 is installed with an over-current signal end OC coupled to the power end PWR via an over-current flag pull-high resistor (ROC1, ROC2, ROC3 or ROC4) and utilized for informing the circuit system if an over-current condition is triggered, so as to prevent the circuit system 10 and the external electronic devices from burnout induced by overloaded currents. That is, the over-current flag pull-high resistors ROC1, ROC2, ROC3, ROC4 function as current sources capable of pulling high voltages of the over-current signal ends OC.

When all the output ports USB[1], USB[2], USB[3], USB[4] are connected to external electronic devices, the circuit system 10 may break down, since current demand explodes. Please refer to FIG. 1B, which is a timing diagram of related signals when the circuit system 10 is powered on. In FIG. 1B, the enable signal ENB indicates to the switch units 100_1, 100_2, 100_3, 100_4 to start operating at a time t0, and accordingly the output voltages Vo[1], Vo[2], Vo[3], Vo[4] start increasing at the time t0 and reach a default voltage Vdft at a time t0'. However, if the output ports USB[1], USB[2], USB[3], USB[4] are respectively connected to four external electronic devices, the four external electronic devices simultaneously draw current from the circuit system 10 when the circuit system 10 is powered on, resulting in a voltage drop in the supply voltage VCC from the time t0 to the time t0'. In the worst case, the voltage drop triggers under voltage protection of other circuit systems sharing the power end PWR with the circuit system 10, which will cause function error or crash of the entire system.

Please refer to FIG. 2A, which is a schematic diagram of another circuit system 20 for preventing the voltage drop of the supply voltage VCC of the prior art. Compared to the circuit system 10, the circuit system 20 additionally includes time delay modules 200_1, 200_2, 200_3, 200_4 utilized for delaying the enable signal ENB for different periods through various combinations of capacitance and resistance to generate enable signals ENB[1], ENB[2], ENB[3], ENB[4]. In FIG. 2B, activation times of the enable signals ENB[1], ENB[2], ENB[3], ENB[4] are staggered. As a result, the switch units 100_1, 100_2, 100_3, 100_4 start functioning at different times, and therefore the supply voltage VCC no longer drops due to the over-drawn currents. However, the time delay modules 200_1, 200_2, 200_3, 200_4 include capacitors and resistors which are disadvantageous to manufacturing costs and system design flexibility.

Therefore, staggering the activation times of the switch modules more economically has been a major focus of the industry.

SUMMARY OF THE INVENTION

It is therefore a primary objective of the claimed invention to provide a delay method and device using the same.

The present invention discloses a delay method for determining an activation time of an output device in a circuit system. The delay method comprises determining resistance of an over-current flag pull-high resistor of the circuit system, generating a current according to the resistance of the over-current flag pull-high resistor, duplicating the current to generate a division current, drawing the division current from a charging current to determine an activation current of the output device, and determining the activation time of the output device according to the activation current.

The present invention further discloses an output device for outputting an output voltage according to an enable signal. The output device comprises an input end for receiving a supply voltage, an output end for outputting the output voltage, an over-current signal end coupled to a power end via an over-current flag pull-high resistor for generating an over-current voltage, an enable end for receiving the enable signal, a current source coupled to the enable end for providing a charging current according to the enable signal, an output transistor comprising a drain end coupled to the input end, a source end coupled to the output end, and a gate end coupled to the current source for determining whether the input end is electrically connected to the output end according to an activation current, and a current mirror module coupled to the over-current signal end, the output transistor and the current source for generating a current according to the over-current voltage, duplicating the current to generate a division current, and drawing the division current from the charging current to generate an activation current.

The present invention further discloses a circuit system for outputting at least one output voltage according to an enable signal. The circuit system comprises a power end for receiving a supply voltage, at least one output port for outputting the at least one output voltage, a control unit for generating the enable signal, and at least one slope control channel each coupled to the power end and one of the at least one output port and comprising an over-current flag pull-high resistor comprising a first end coupled to the power end, and a second end for modulating a response rate for the enable signal, an output device coupled to the power end, the control unit, a ground end, the output port and the second end of the over-current flag pull-high resistor for electrically connecting the power end and the output port according to the enable signal, and delaying a time when the power end is electrically connected to the output port according to resistance of the over-current flag pull-high resistor, and an output capacitor comprising one end coupled between the output device and the output port, and the other end coupled to the ground end for generating one of the at least one output voltage according to a conduction status of the output device.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1B is a timing schematic diagram of related signals when the circuit system shown in FIG. 1A is powered on.

FIG. 2B is a timing schematic diagram of related signals when the circuit system shown in FIG. 2A is powered on.

FIG. 3C is a timing schematic diagram of related signals when the circuit system shown in FIG. 3A is powered on.

DETAILED DESCRIPTION

Figure 3A:
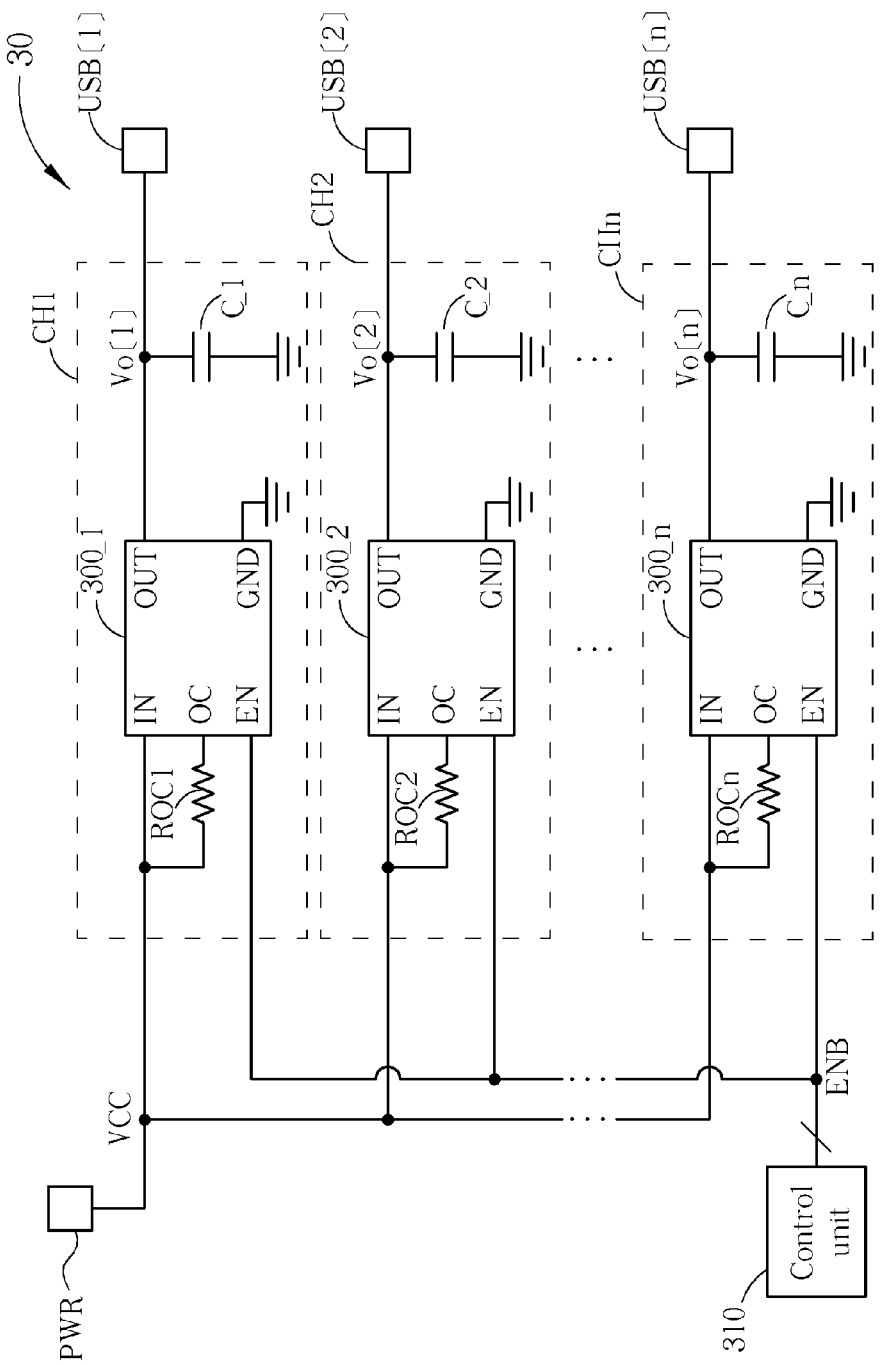
FIG. 3A is a schematic diagram of a circuit system according to an embodiment of the present invention.

Please refer to FIG. 3A, which is a schematic diagram of a circuit system 30 according to an embodiment of the present invention. The circuit system 30 includes a power end PWR, a control unit 310, slope control channels CH1-CHn and output ports USB[1]-USB[n]. The slope control channels CH1-CHn correspondingly include output devices 300_1-300_n, over-current flag pull-high resistors ROC1-ROCn and output capacitors C_1-C_n. The circuit system 30 is similar to the circuit system 10 shown in FIG. 1, and differs in the over-current flag pull-high resistors ROC1-ROCn characterized by different resistances to stagger activation times of the output devices 300_1-300_n. The power end PWR is utilized for receiving a supply voltage VCC. The output ports USB[1]-USB[n] are utilized for outputting output voltages Vo[1]-Vo[n]. The control unit 310 is utilized for generating an enable signal ENB to activate the output devices 300_1-300_n. The output devices 300_1-300_n are utilized for determining whether to transmit the supply voltage VCC to the output ports USB[1]-USB[n] according to the enable signal ENB, and delaying times when the power end PWR is electrically connected to the output ports USB[1]-USB[n] according to resistances of the over-current flag pull-high resistors ROC1-ROCn. That is, the over-current flag pull-high resistors ROC1-ROCn are further utilized for controlling "response rates" of the output devices 300_1-300 in response to the enable signal ENB.

Figure 1A:
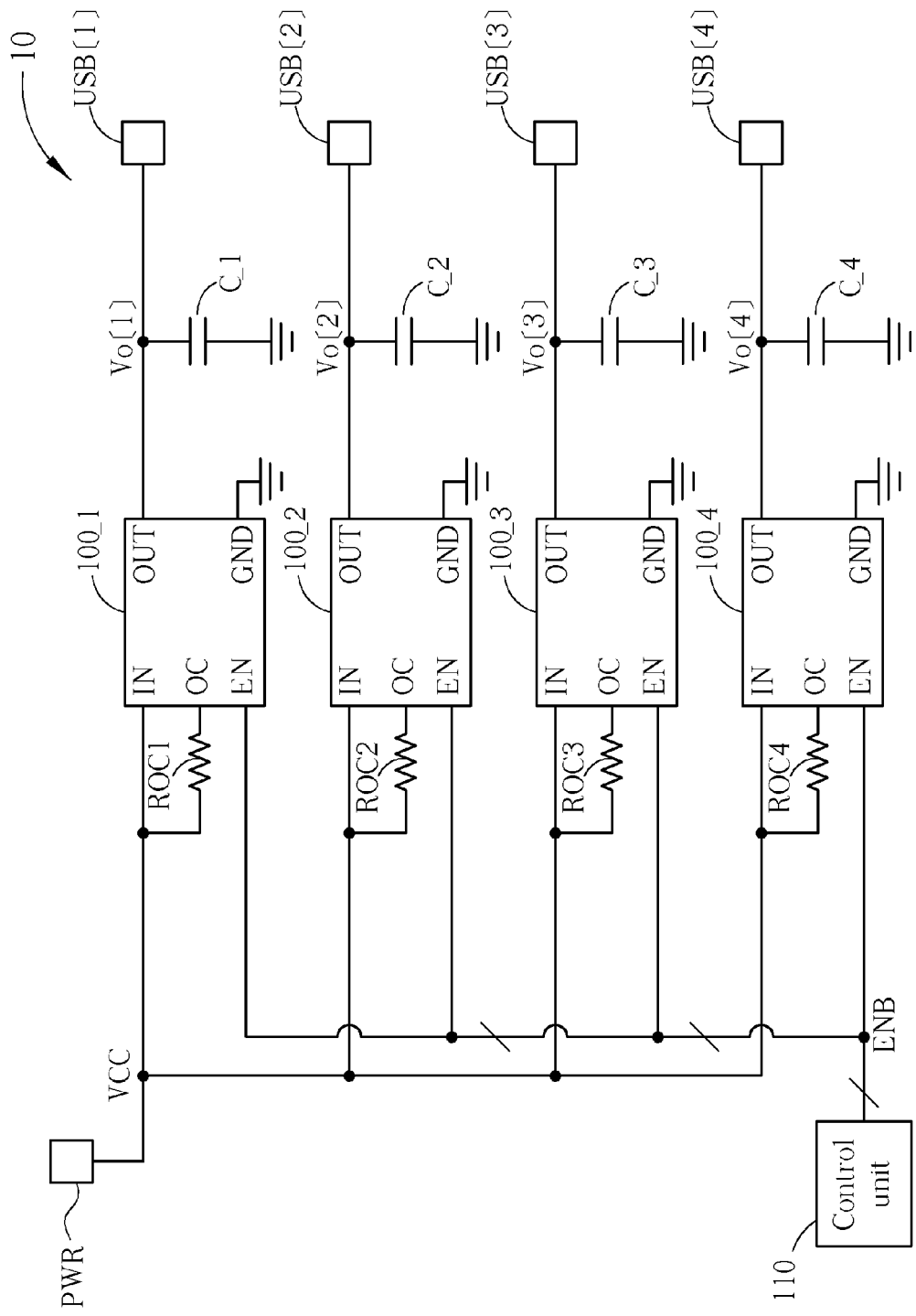
FIG. 1A is a schematic diagram of a circuit system of the prior art.
Figure 1B:
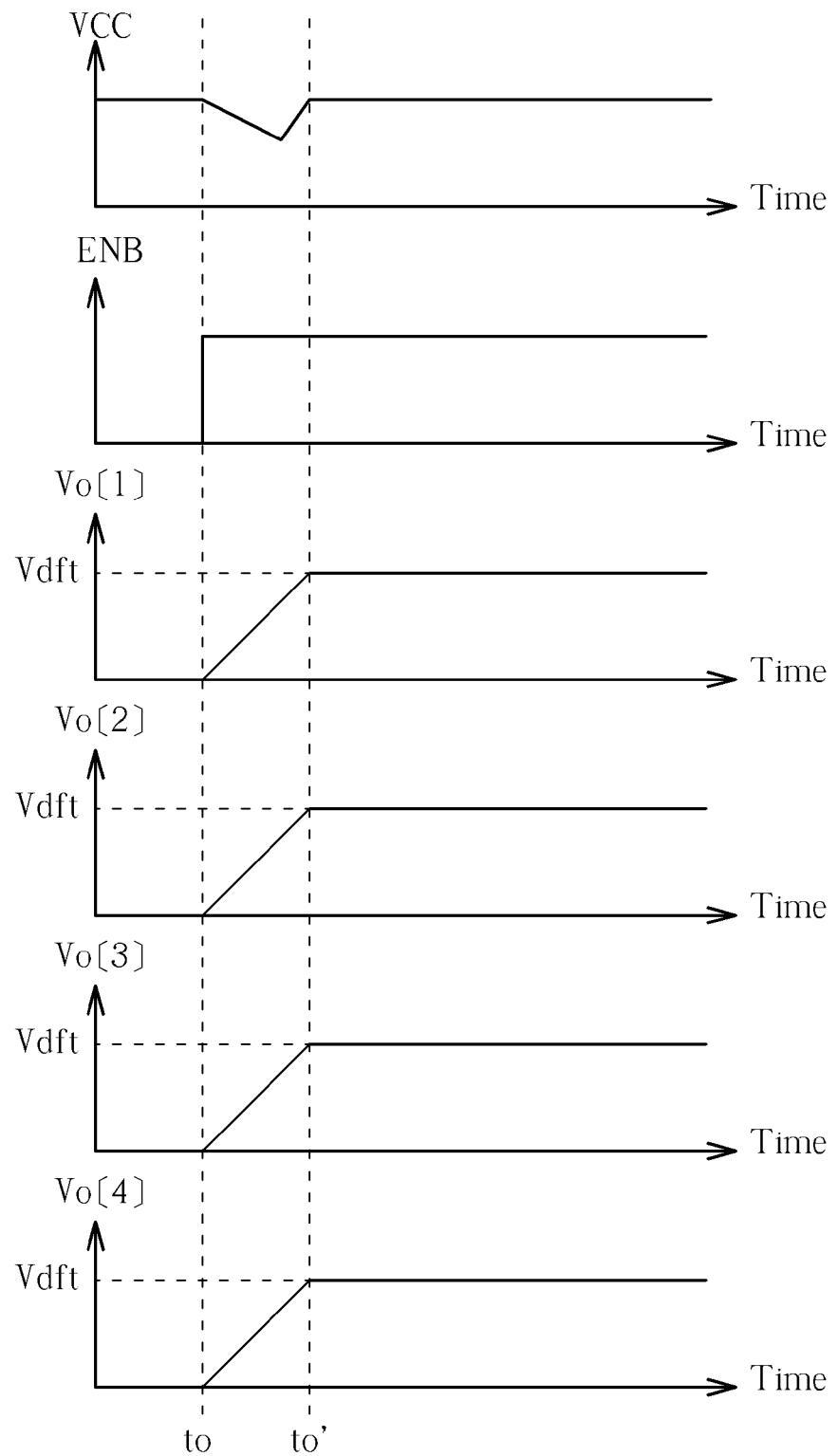
Figure 2A:
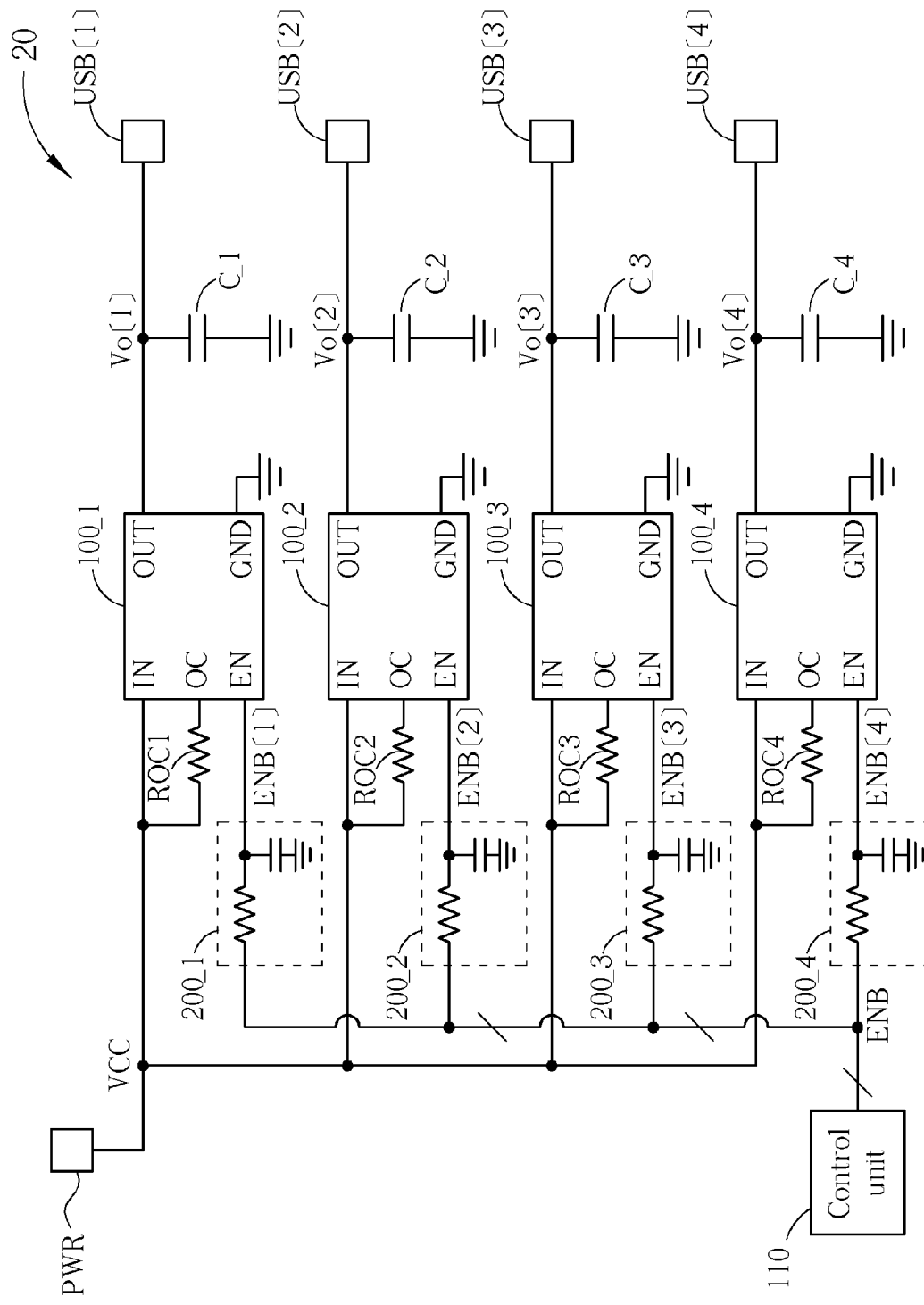
FIG. 2A is a schematic diagram of another circuit system of the prior art.
Figure 2B:
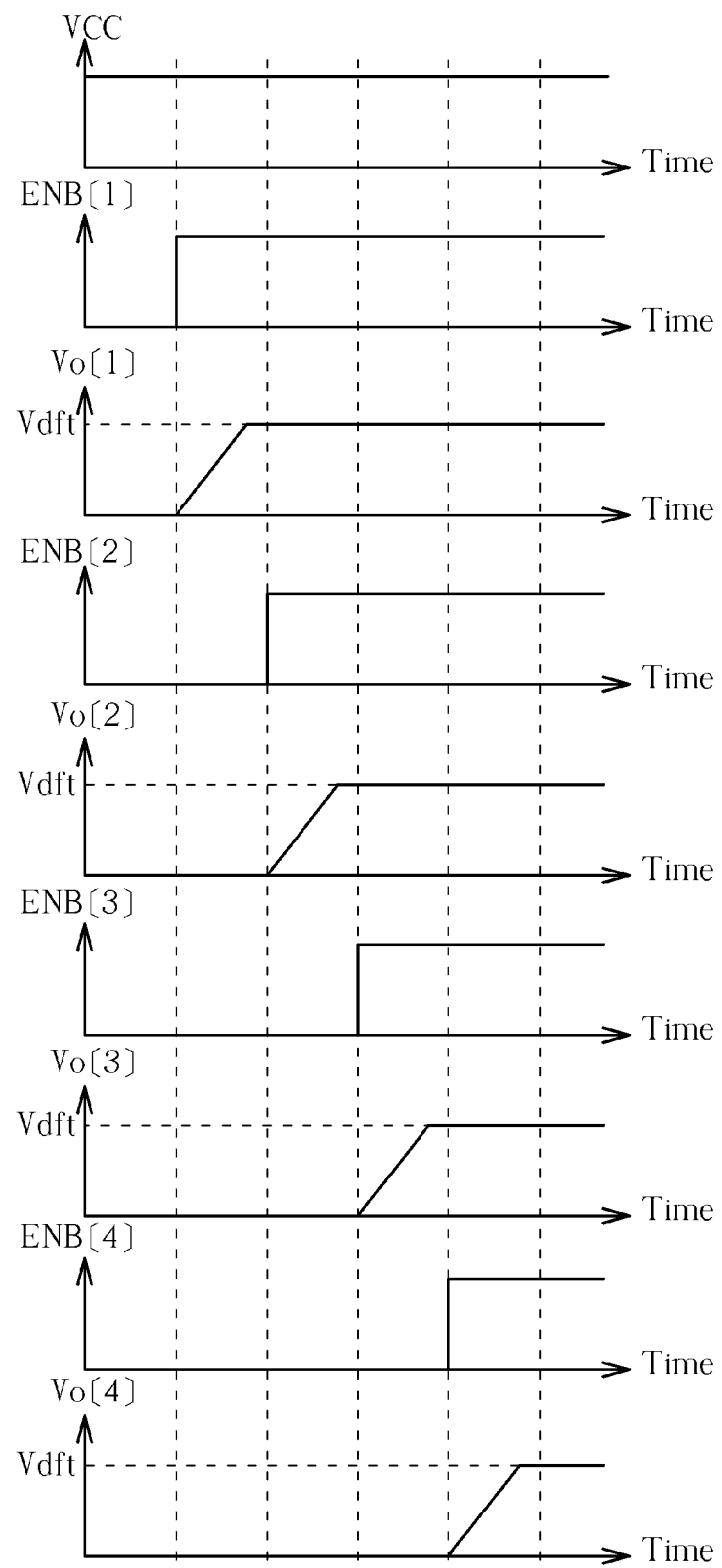

In short, to stagger the activation times of the output devices 300_1-300_n without applying a resistance-capacitance (RC) delay method and complex control circuits, the over-current flag pull-high resistors ROC1-ROCn are further utilized for delaying the activation times of the output devices 300_1-300_n. That is, main architecture of the circuit system 10 shown in FIG. 1A is preserved, and only the resistances of the over-current flag pull-high resistors ROC1-ROCn are adjusted to economically stagger the activation times of the output devices 300_1-300_n.

Figure 3B:
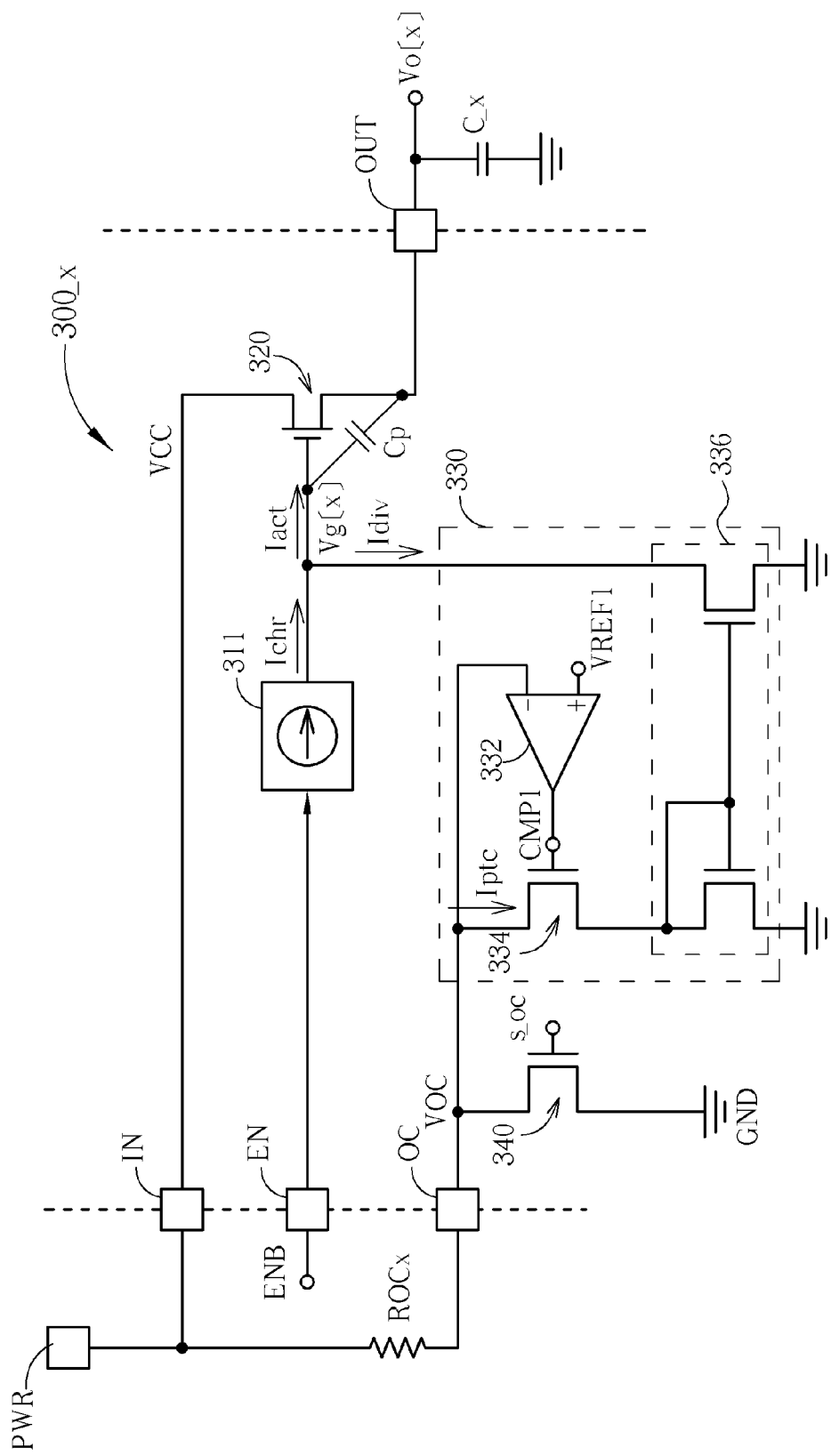
FIG. 3B is a schematic diagram of an output device of the circuit system shown in FIG. 3A.

Certainly, in order to delay the activation times, the output devices 300_1-300_n are designed with corresponding signal processing schemes. Please refer to FIG. 3B, which is a schematic diagram of an output device 300_x of the output devices 300_1-300_n. The output device 300_x includes a current source 311, an output transistor 320 and a current mirror module 330. The current source 311 is utilized for providing a charging current Ichr according to the enable signal ENB received by an enable end EN. The output transistor 320 is utilized for determining whether an input end IN is electrically connected to an output end OUT according to an activation current Iact to determine whether to transmit the supply voltage VCC received by the input end IN to the output end OUT. The current mirror module 330 is utilized for generating a current Iptc according to the over-current voltage VOC, duplicating the current Iptc to generate a division current Idiv, and drawing the division current Idiv from the charging current Ichr to generate the activation current Iact.

In detail, the current mirror module 330 includes an operational amplifier 332, a p-type transistor 334 and a current mirror 336. The operational amplifier is utilized for comparing the over-current voltage VOC and a first reference voltage VREF1 to generate a computation result CMP1. The p-type transistor 334 is utilized for generating the current Iptc according to the computation result CMP1. The current mirror 336 is utilized for duplicating the current Iptc to generate the division current Idiv. That is, the current mirror module 330 determines when to draw the division current Idiv based on the computation result CMP1. Since the activation current Iact is equal to the charging current Ichr minus the division current Idiv, i.e. Iact=Ichr−Idiv, the activation current Iact is determined as long as the division current Idiv is determined. Since the activation current Iact charges a parasitic capacitor Cp coupled between a gate end and a source end of the output transistor 320, flow of the activation current Iact further determines a rising rate of a gate voltage Vg[x] of the output transistor 320 as well as timing of the output transistor 320 being enabled. That is, the over-current flag pull-high resistors ROCx is utilized for determining the response rate of the output device 300_x in response to the enable signal ENB.

Therefore, the time when the current mirror module 330 starts drawing the division current Idiv from the current source 310 can be determined through adjusting the over-current voltage VOC and the first reference voltage VREF1, so as to adjust the rising rate of the gate voltage Vg[x] of the output voltage 320 as well as the timing when the output transistor 320 is enabled.

In the output device 300_x, since the over-current voltage VOC is determined by the resistance of the over-current flag pull-high resistors ROCx, the activation current Iact can be controlled through adjusting the resistance of the over-current flag pull-high resistors ROCx as well as the timing of the output transistor 320 being enabled. Therefore, the resistances of the over-current flag pull-high resistors ROC1-ROCn can be designed to adjust the activation currents Iact of the output device 300_1-300_n, so as to stagger the activation times of the output device 300_1-300_n and prevent the supply voltage VCC from dropping instantly.

Figure 3C:
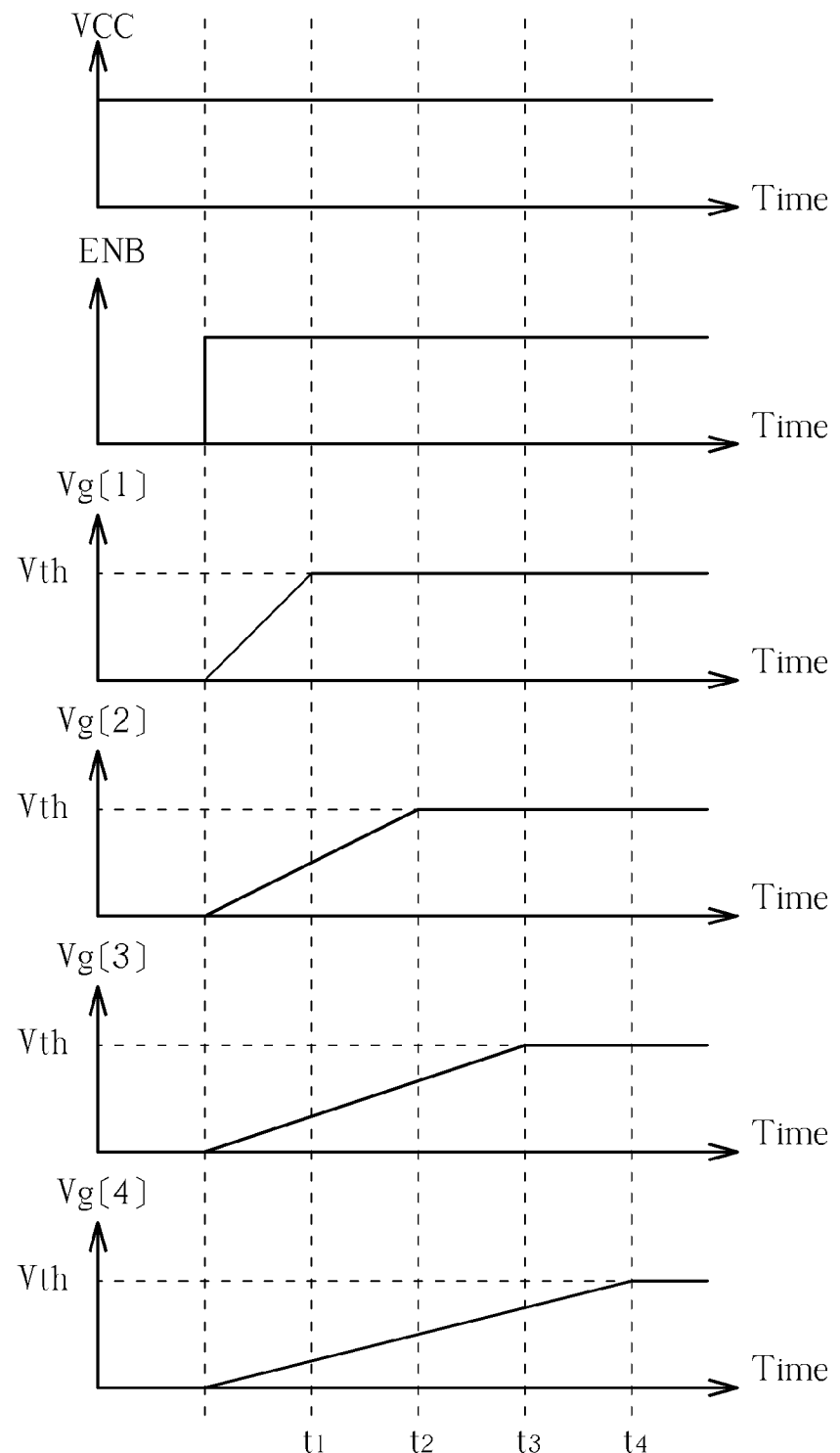

For example, assume the number of the output devices is four, i.e. n=4. Please refer to FIG. 3C, which is a timing diagram of related signals when the output devices 300_1-300_4 are activated. In FIG. 3C, Vg[1], Vg[2], Vg[3], Vg[4]

respectively represent gate voltages of the output transistors 320 of the output devices 300_1-300_4. Since the activation currents Iact of the output devices 300_1-300_4 are different, rising rates of the gate voltages Vg[1], Vg[2], Vg[3], Vg[4] are different, and therefore the gate voltages Vg[1], Vg[2], Vg[3], Vg[4] reach a threshold voltage Vth of the output transistor 320 at different times t1, t2, t3, t4. In other words, the present invention further utilizes the over-current flag pull-high resistors for determining activation timing of the output transistors 320 to avoid employing large capacitors which are disadvantageous to size and manufacturing costs of the circuit system 30.

Therefore, through adjusting the flow of the activation current Iact, the output device 300_x controls the time when the gate voltage Vg[x] reaches the threshold voltage Vth to vary a switching time of the output transistor 320. In addition, to preserve original over-current protection functions, the output device 300_x further includes an over-current transistor 340 for determining a logic level of the over-current signal end OC capable of indicating whether an over-current condition is triggered according to an over-current signal s_oc. As a result, the circuit system 30 can inform related circuits to activate current protection schemes to prevent the output device 300_x and external electronic devices connected to the output port USB[x], such as a portable hard disk, digital camera, etc., from being damaged by overloaded currents.

Figure 4:
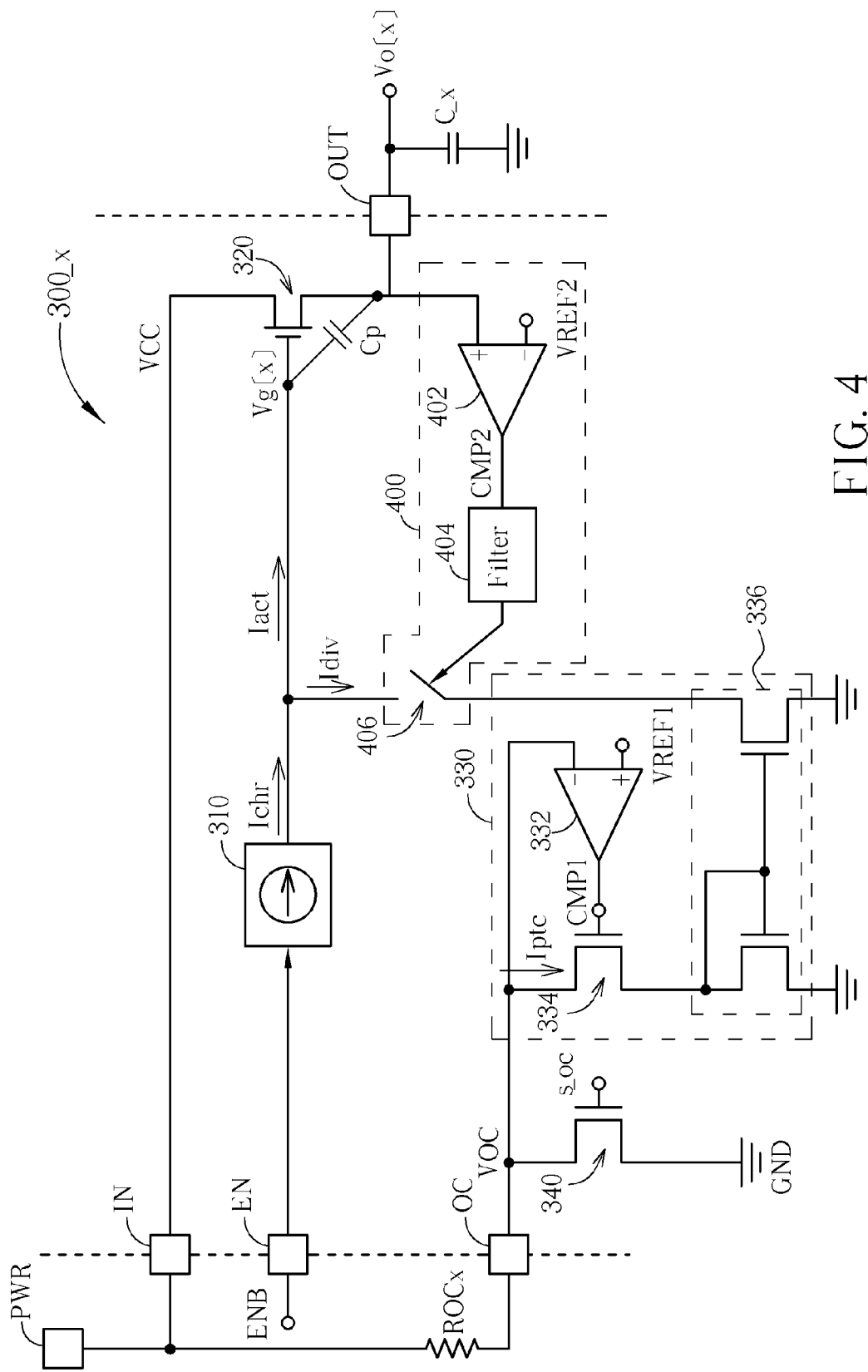
FIG. 4 is a schematic diagram of an alternative embodiment of the output device shown in FIG. 3B.

On the other hand, to stabilize the output voltage OUT after start-up, the gate voltage Vg[x] has to ramp up fast after start-up, and the activation current Iact should be held at a high level. To accomplish this function, the output device 300_x preferably further includes a detection module 400, as illustrated in FIG. 4. The detection module 400 is utilized for determining whether to draw the division current Idiv from the charging current Ichr according to the output voltage Vo[x]. The detection module 400 includes a comparator 402, a filter 404 and a switch 406. The comparator 402 is utilized for comparing the output voltage Vo[x] and a second reference voltage VREF2 to generate a comparison result CMP2. The filter 404 is utilized for filtering out noise from the comparison result CMP2 to generate an output indication signal FG. Finally, the switch 406 determines whether the current source 310 and the output transistor 320 are electrically connected to the current mirror module 330 based on the output indication signal FG.

As a result, the second reference voltage VREF2 is designed as VREF2=VCC−Vth. As long as the output voltage Vo[x] exceeds the second reference voltage VREF2, implying that the start-up process is completed, the detection module 400 sends out the output indication signal FG to open the switch 406, and hence the activation current Iact can be held at the high level to resist the noise at the gate voltage Vg[x].

Preferably, the circuit system 30 is a Universal Serial Bus (USB) switch device for determining whether to transmit the supply voltage VCC to the output end OUT according to the enable signal ENB. Certainly, the delay method of the present invention can be applied to all output devices designed with over-current flag pull-high resistors, and is not limited to the USB switch device. The present invention staggers the activation time points of the output devices 300_1-300_n without employing any large capacitors to economically avoid the voltage drop of the supply voltage VCC caused by over-drawn currents.

Figure 5:
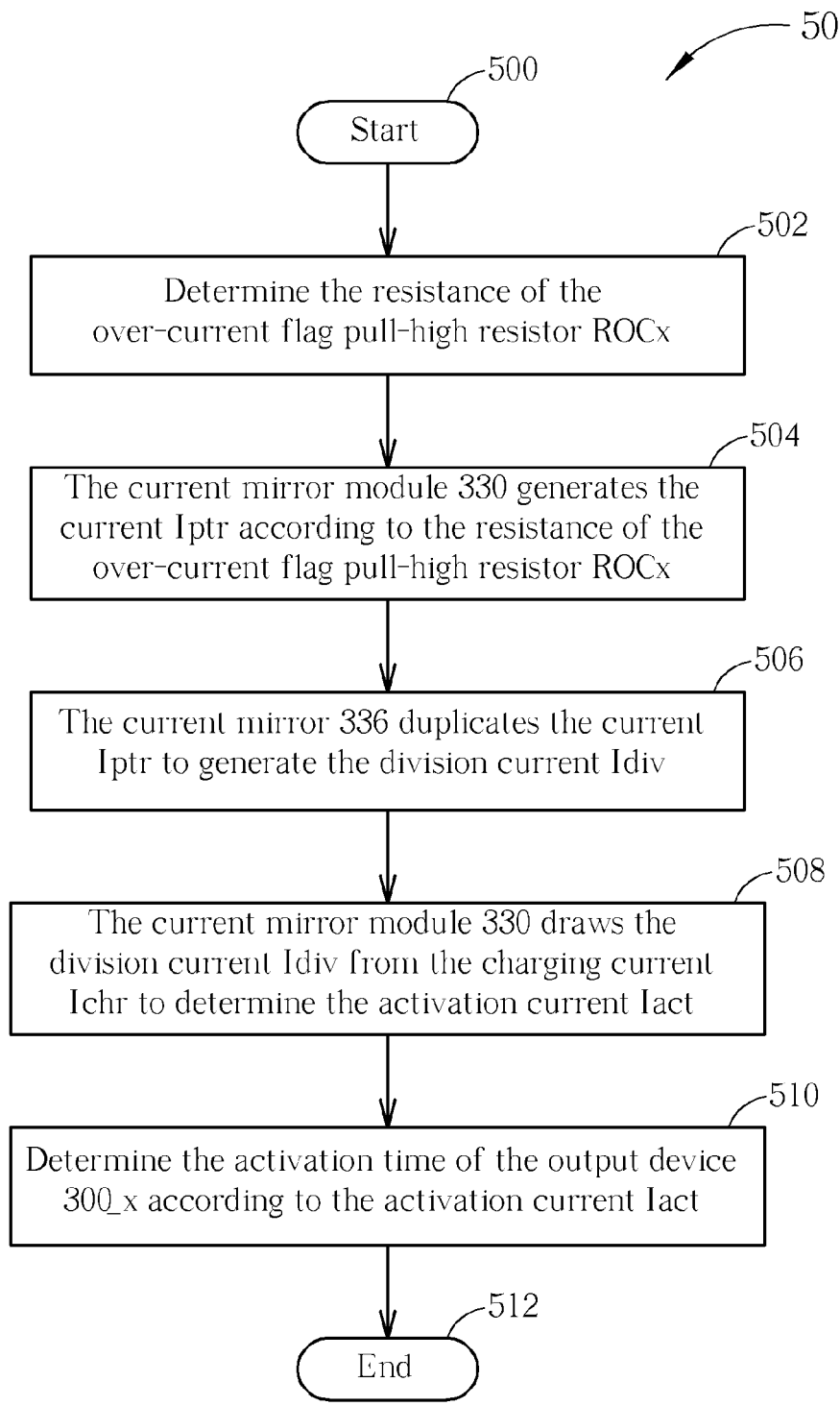
FIG. 5 is a schematic diagram of a delay process according to an embodiment of the present invention.

Operations of the output device 300_x can be summarized into a process 50, as illustrated in FIG. 5. The process 50 includes the following steps:
Step 500: Start.
Step 502: Determine the resistance of the over-current flag pull-high resistor ROCx.
Step 504: The current mirror module 330 generates the current Iptr according to the resistance of the over-current flag pull-high resistor ROCx.
Step 506: The current mirror 336 duplicates the current Iptr to generate the division current Idiv.
Step 508: The current mirror module 330 draws the division current Idiv from the charging current Ichr to determine the activation current Iact.
Step 510: Determine the activation time of the output device 300_x according to the activation current Iact.
Step 512: End.

Details of the process 50 can be referred in the above, and are not further narrated herein.

In the prior art, to stagger the activation times of the switch units 100_1, 100_2, 100_3, 100_4, the circuit system 20 has to employ large capacitors to respectively delay the enable signal ENB as enable signals EN[1], EN[2], EN[3], EN[4]. However, the usage of the large capacitors dramatically increases manufacturing costs and design limitations of the circuit system 20. In comparison, the present invention adjusts the rising rate of the gate voltage Vg[x] through varying the resistances of the over-current flag pull-high resistors ROC1-ROCn, so as to stagger the activation times of the output devices 300_1-300_n. As a result, the circuit system 30 can disperse the activation times of the output devices 300_1-300_n without applying the resistor-capacitor (RC) delay method, so as to economically avoid the voltage drop of the supply voltage VCC caused by the over-drawn currents.

To sum up, the present invention staggers the activation times of the output devices through varying the resistances of over-current flag pull-high resistors to avoid the voltage drop of the supply voltage caused by the over-drawn currents without applying the RC delay method.

Those skilled in the art will readily observe that numerous modifications and alterations of the device and method may be made while retaining the teachings of the invention.

What is claimed is:

1. A delay method for determining an activation time of an output device in a circuit system, the delay method comprising:
   determining resistance of an over-current flag pull-high resistor of the circuit system;
   generating a current according to the resistance of the over-current flag pull-high resistor;
   duplicating the current to generate a division current;
   drawing the division current from a charging current to determine an activation current of the output device; and
   determining the activation time of the output device according to the activation current.

2. The delay method of claim 1, wherein the step of duplicating the current to generate the division current comprises:
   comparing an over-current voltage of the output device and a first reference voltage to generate a computation result;
   generating the current according to the computation result; and
   duplicating the current to generate the division current.

3. The delay method of claim 1, wherein the step of determining the activation time of the output device according to the activation current comprises:
   the activation current charging a gate of an output transistor of the output device; and assigning a time when a gate voltage of the gate reaches a threshold voltage of the output transistor as the gate is charged to be the activation time.

4. The delay method of claim 1 further comprising determining whether to draw the division current from the charging current according to an output voltage of the output device.

5. The delay method of claim 4, wherein the step of determining whether to draw the division current from the charging current according to the output voltage of the output device comprises:
   comparing the output voltage and a second reference voltage to generate a comparison result;
   filtering out noise from the comparison result to generate an output indication signal; and
   determining whether a current source and the output transistor are electrically connected to a current mirror module.

6. The delay method of claim 5, wherein the second reference voltage is equal to a supply voltage minus a threshold voltage of the output transistor.

7. The delay method of claim 1, wherein the over-current flag pull-high resistor is coupled between an over-current signal end of the output device and a power end of the circuit system, and is utilized for determining flow of the current.

8. The delay method of claim 1, wherein the activation current is equal to the charging current minus the division current.

9. The delay method of claim 1, wherein the output device is a Universal Serial Bus (USB) switch device for determining whether the circuit system is electrically connected to an external electronic device via a USB according to an enable signal of the circuit system.

10. The delay method of claim 9, wherein the enable signal is utilized for indicating a current source of the output device to provide the charging current.

11. An output device for outputting an output voltage according to an enable signal, the output device comprising:
    an input end, for receiving a supply voltage;
    an output end, for outputting the output voltage;
    an over-current signal end, coupled to a power end via an over-current flag pull-high resistor, for generating an over-current voltage;
    an enable end, for receiving the enable signal;
    a current source, coupled to the enable end, for providing a charging current according to the enable signal;
    an output transistor, comprising a drain end coupled to the input end, a source end coupled to the output end, and a gate end coupled to the current source, for determining whether the input end is electrically connected to the output end according to an activation current; and
    a current mirror module, coupled to the over-current signal end, the output transistor and the current source, for generating a current according to the over-current voltage, duplicating the current to generate a division current, and drawing the division current from the charging current to generate an activation current.

12. The output device of claim 11, wherein the current mirror module comprises:
    an operational amplifier, coupled to the over-current signal end, for comparing the over-current voltage and a first reference voltage to generate a computation result;
    a p-type transistor, comprising a source end coupled to the over-current signal end, a gate end coupled to the operational amplifier, and a drain end, for generating the current according to the computation result; and
    a current mirror, coupled to the p-type transistor and a ground end, for duplicating the current to generate the division current.

13. The output device of claim 11 further comprising:
    an over-current transistor, coupled between the over-current signal end and a ground end, for determining whether the over-current flag pull-high resistor is electrically connected to the ground end according to an over-current signal; and
    a detection module, coupled to the output transistor, the output end, the current source and the current mirror module, for determining whether to draw the division current from the charging current according to the output voltage.

14. The output device of claim 13, wherein the detection module comprises:
    a comparator, coupled to the output end and the source end of the output transistor, for comparing the output voltage and a second reference voltage to generate a comparison result;
    a filter, coupled to the comparator, for filtering out noise from the comparison result to generate an output indication signal; and
    a switch, coupled to the current source, the output transistor, the filter and the current mirror module, for determining whether the current source and the output transistor are electrically connected to the current mirror module according to the output indication signal.

15. The output device of claim 14, wherein the second reference voltage is equal to the supply voltage minus a threshold voltage of the output transistor.

16. The output device of claim 11, wherein the over-current flag pull-high resistor is coupled between the over-current signal end and the power end, and is utilized for determining flow of the current.

17. The output device of claim 11, wherein the activation current is equal to the charging current minus the division current.

18. The output device of claim 11, wherein the current source charges the gate end of the output transistor by the activation current to determine an activation time of the gate end.

19. The output device of claim 11, which is a Universal Serial Bus (USB) switch device for determining whether the supply voltage is provided to an external electronic device according to the enable signal.

20. A circuit system for outputting at least one output voltage according to an enable signal, the circuit system comprising:
    a power end, for receiving a supply voltage;
    at least one output port, for outputting the at least one output voltage;
    a control unit, for generating the enable signal; and
    at least one slope control channel, each coupled to the power end and one of the at least one output port and comprising:
        an over-current flag pull-high resistor, comprising a first end coupled to the power end, and a second end, for modulating a response rate for the enable signal;
        an output device, coupled to the power end, the control unit, a ground end, the output port and the second end of the over-current flag pull-high resistor, for electrically connecting the power end and the output port according to the enable signal, and delaying a time when the power end is electrically connected to the output port according to resistance of the over-current flag pull-high resistor; and an output capacitor, comprising one end coupled between the output device and the output port, and the other end coupled to the ground end, for generating one of the at least one output voltage according to a conduction status of the output device.

21. The circuit system of claim 20, wherein the output device comprises:
   an input end, coupled to the power end, for receiving the supply voltage;
   an output end, coupled to the output port, for outputting the output voltage;
   an over-current signal end, coupled to the second end of the over-current flag pull-high resistor, for generating an over-current voltage;
   an enable end, coupled to the control unit, for receiving the enable signal;
   a current source, coupled to the enable end, for providing a charging current according to the enable signal;
   an output transistor, comprising a drain end coupled to the input end, a source end coupled to the output end, and a gate end coupled to the current source, for determining whether the input end is electrically connected to the output end according to an activation current; and
   a current mirror module, coupled to the over-current signal end, the output transistor and the current source, for generating a current according to the over-current voltage, duplicating the current to generate a division current, and drawing the division current from the charging current to generate an activation current for controlling the response rate;
   wherein the response rate is a rising rate of a gate voltage of the output transistor.

22. The circuit system of claim 21, wherein the current mirror module comprises:
   an operational amplifier, coupled to the over-current signal end, for comparing the over-current voltage and a first reference voltage to generate a computation result;
   a p-type transistor, comprising a source end coupled to the over-current signal end, a gate end coupled to the operational amplifier, and a drain end, for generating the current according to the computation result; and
   a current mirror, coupled to the p-type transistor and the ground end, for duplicating the current to generate the division current.

23. The circuit system of claim 21, wherein the output device further comprises:
   an over-current transistor, coupled between the over-current signal end and the ground end, for determining whether the over-current signal end is electrically connected to the ground according to an over-current signal; and
   a detection module, coupled to the output transistor, the output end, the current source and the current mirror module, for determining whether to draw the division current from the charging current according to the output voltage.

24. The circuit system of claim 23, wherein the detection module comprises:
   a comparator, coupled to the output end and the source end of the output transistor, for comparing the output voltage and a second reference voltage to generate a comparison result;
   a filter, coupled to the comparator, for filtering out noise from the comparison result to generate an output indication signal; and
   a switch, coupled to the current source, the output transistor, the filter and the current mirror module, for determining whether the current source and the output transistor are electrically connected to the current mirror module according to the output indication signal.

25. The circuit system of claim 24, wherein the second reference voltage is equal to the supply voltage minus a threshold voltage of the output transistor.

26. The circuit system of claim 21, wherein the over-current flag pull-high resistor is coupled between the over-current signal end and the power end, and is utilized for determining flow of the current.

27. The circuit system of claim 21, wherein the activation current is equal to the charging current minus the division current.

28. The circuit system of claim 21, wherein the current source charges the gate end of the output transistor by the activation current to determine an activation time of the gate end.

29. The circuit system of claim 20, which is a Universal Serial Bus (USB) switch device for determining whether the supply voltage is provided to an external electronic device according to the enable signal.

* * * * *